(12) United States Patent
Chang Chien et al.

(10) Patent No.: US 8,106,492 B2
(45) Date of Patent: Jan. 31, 2012

(54) SEMICONDUCTOR PACKAGE AND MANUFACTURING METHOD THEREOF

(75) Inventors: Pao-Huei Chang Chien, Kaohsiung County (TW); Ping-Cheng Hu, Kaohsiung (TW); Po-Shing Chiang, Kaohsiung County (TW); Wei-Lun Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 107 days.

(21) Appl. No.: 12/550,645

(22) Filed: Aug. 31, 2009

(65) Prior Publication Data

US 2010/0258934 A1    Oct. 14, 2010

Related U.S. Application Data

(60) Provisional application No. 61/168,220, filed on Apr. 10, 2009.

(51) Int. Cl.
*H01L 23/495* (2006.01)
*H01L 23/48* (2006.01)

(52) U.S. Cl. .. 257/676; 257/666; 257/784; 257/E23.037

(58) Field of Classification Search ............... 257/676, 257/666, 784, E23.037
See application file for complete search history.

(56) References Cited

U.S. PATENT DOCUMENTS

| | | | |
|---|---|---|---|
| 4,948,032 A | 8/1990 | Dunaway et al. | |
| 5,200,025 A | 4/1993 | Toei et al. | |
| 5,389,739 A | 2/1995 | Mills | |
| 5,800,958 A | 9/1998 | Manteghi | |
| 5,804,468 A | 9/1998 | Tsuji et al. | |
| 5,847,458 A * | 12/1998 | Nakamura et al. | 257/738 |
| 5,900,676 A | 5/1999 | Kweon et al. | |
| 5,969,412 A | 10/1999 | Matsutomo | |
| 6,001,671 A | 12/1999 | Fjelstad | |
| 6,025,650 A | 2/2000 | Tsuji et al. | |
| 6,093,584 A | 7/2000 | Fjelstad | |
| 6,097,098 A | 8/2000 | Ball | |
| 6,132,593 A | 10/2000 | Tan | |
| 6,191,494 B1 * | 2/2001 | Ooyama et al. | 257/796 |
| 6,201,292 B1 | 3/2001 | Yagi et al. | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,303,985 B1 | 10/2001 | Larson et al. | |

(Continued)

FOREIGN PATENT DOCUMENTS

CN           1726591           1/1996

(Continued)

OTHER PUBLICATIONS

Chien et al. U.S. Appl. No. 12/547,787, filed Aug. 26, 2009 for "Manufacturing Method of Advanced Quad Flat Non-Leaded Package". Office Action mailed Jun. 7, 2011.

(Continued)

*Primary Examiner* — Nitin Parekh
(74) *Attorney, Agent, or Firm* — Cooley LLP

(57) ABSTRACT

The advanced quad flat non-leaded package structure includes a carrier having a die pad and a plurality of leads, at least a chip, a plurality of wires, and a molding compound. The rough surface of the carrier enhances the adhesion between the carrier and the surrounding molding compound.

21 Claims, 8 Drawing Sheets

U.S. PATENT DOCUMENTS

| | | |
|---|---|---|
| 6,306,685 B1 | 10/2001 | Liu et al. |
| 6,333,252 B1 | 12/2001 | Jung et al. |
| 6,342,730 B1 | 1/2002 | Jung et al. |
| 6,379,996 B1 | 4/2002 | Suzuki |
| 6,410,987 B1 | 6/2002 | Kanemoto et al. |
| 6,424,047 B1 | 7/2002 | Chua et al. |
| 6,429,536 B1 | 8/2002 | Liu et al. |
| 6,451,627 B1 | 9/2002 | Coffman |
| 6,495,909 B2 | 12/2002 | Jung et al. |
| 6,498,099 B1 | 12/2002 | McLellan et al. |
| 6,501,162 B2 | 12/2002 | Sakamoto et al. |
| 6,525,406 B1 | 2/2003 | Chung et al. |
| 6,528,877 B2 | 3/2003 | Ernst et al. |
| 6,528,879 B2 | 3/2003 | Sakamoto et al. |
| 6,528,893 B2 | 3/2003 | Jung et al. |
| 6,545,347 B2 | 4/2003 | McClellan |
| 6,548,328 B1 | 4/2003 | Sakamoto et al. |
| 6,551,859 B1 | 4/2003 | Lee et al. |
| 6,562,660 B1 | 5/2003 | Sakamoto et al. |
| 6,585,905 B1 | 7/2003 | Fan et al. |
| 6,586,677 B2 | 7/2003 | Glenn |
| 6,635,956 B2 | 10/2003 | Sakamoto et al. |
| 6,635,957 B2 | 10/2003 | Kwan et al. |
| 6,683,368 B1 | 1/2004 | Mostafazadeh |
| 6,689,640 B1 | 2/2004 | Mostafazadeh |
| 6,700,188 B2 | 3/2004 | Lin |
| 6,706,547 B2 | 3/2004 | Sakamoto et al. |
| 6,713,849 B2 | 3/2004 | Hasebe et al. |
| 6,740,961 B1 | 5/2004 | Mostafazadeh |
| 6,759,271 B2 | 7/2004 | Miyazaki |
| 6,777,788 B1 | 8/2004 | Wan et al. |
| 6,812,063 B2 | 11/2004 | Huang |
| 6,812,410 B2 | 11/2004 | Sakamoto et al. |
| 6,812,552 B2 | 11/2004 | Islam et al. |
| 6,818,973 B1 | 11/2004 | Foster |
| 6,861,295 B2 | 3/2005 | Jung et al. |
| 6,861,734 B2 | 3/2005 | Minamio et al. |
| 6,906,414 B2 | 6/2005 | Zhao et al. |
| 6,927,483 B1 | 8/2005 | Lee et al. |
| 6,933,594 B2 | 8/2005 | McLellan et al. |
| 6,946,324 B1 | 9/2005 | McLellan et al. |
| 6,949,816 B2 | 9/2005 | Brown et al. |
| 6,975,022 B2 | 12/2005 | Sakamoto et al. |
| 6,975,038 B1 | 12/2005 | Mostafazadeh |
| 6,984,880 B2 | 1/2006 | Minamio et al. |
| 6,995,459 B2 | 2/2006 | Lee et al. |
| 6,995,460 B1 | 2/2006 | McLellan et al. |
| 7,026,190 B2 | 4/2006 | Kobayashi et al. |
| 7,049,177 B1 | 5/2006 | Fan et al. |
| 7,060,535 B1 | 6/2006 | Sirinorakul et al. |
| 7,091,606 B2 | 8/2006 | Sakamoto et al. |
| 7,095,100 B2 | 8/2006 | Kasuya |
| 7,125,798 B2 | 10/2006 | Sakamoto et al. |
| 7,129,116 B2 | 10/2006 | Islam et al. |
| 7,145,222 B2 | 12/2006 | Gai |
| 7,166,495 B2 | 1/2007 | Ball |
| 7,173,336 B2 | 2/2007 | Sakamoto et al. |
| 7,193,302 B2 | 3/2007 | Tseng |
| 7,196,416 B2 | 3/2007 | Hochstenbach et al. |
| 7,208,826 B2 | 4/2007 | Sakamoto et al. |
| 7,215,009 B1 | 5/2007 | Leng et al. |
| 7,226,811 B1 | 6/2007 | McLellan et al. |
| 7,235,888 B2 | 6/2007 | Hosokawa et al. |
| 7,247,526 B1 | 7/2007 | Fan et al. |
| 7,247,938 B2 | 7/2007 | Groenhuis et al. |
| 7,262,491 B2 | 8/2007 | Islam et al. |
| 7,271,032 B1 | 9/2007 | McLellan et al. |
| 7,301,225 B2 | 11/2007 | Wong et al. |
| 7,319,266 B2 | 1/2008 | St. Germain et al. |
| 7,344,920 B1 | 3/2008 | Kirloskar et al. |
| 7,348,663 B1 | 3/2008 | Kirloskar et al. |
| 7,351,612 B2 | 4/2008 | Gai |
| 7,382,044 B1 | 6/2008 | Yilmaz et al. |
| 7,407,834 B2 | 8/2008 | Shimanuki et al. |
| 7,410,834 B2 | 8/2008 | Fukaya et al. |
| 7,443,012 B2 | 10/2008 | Yamaguchi |
| 7,446,397 B2 | 11/2008 | Gai |
| 7,459,347 B2 | 12/2008 | Shimanuki et al. |
| 7,494,557 B1 | 2/2009 | Peterson |
| 7,518,156 B2 | 4/2009 | Hasebe et al. |
| 7,545,026 B2 | 6/2009 | Six |
| 7,550,322 B2 | 6/2009 | Kimura |
| 7,563,648 B2 | 7/2009 | Islam et al. |
| 7,598,606 B2 | 10/2009 | Chow et al. |
| 7,608,482 B1 | 10/2009 | Bayan |
| 7,622,332 B2 | 11/2009 | Islam et al. |
| 7,679,172 B2 | 3/2010 | Huang et al. |
| 7,683,461 B2 | 3/2010 | Lau |
| 7,786,557 B2 | 8/2010 | Hsieh et al. |
| 7,790,500 B2 | 9/2010 | Ramos et al. |
| 7,799,611 B2 | 9/2010 | Ramos et al. |
| 7,834,431 B2 | 11/2010 | Hooper et al. |
| 7,834,469 B2 | 11/2010 | Chuang et al. |
| 7,838,974 B2 | 11/2010 | Poddar et al. |
| 7,846,775 B1 | 12/2010 | Lee et al. |
| 2001/0052600 A1 | 12/2001 | Sakamoto et al. |
| 2002/0084518 A1 | 7/2002 | Hasebe et al. |
| 2002/0096790 A1 | 7/2002 | Kasuya |
| 2002/0109214 A1 | 8/2002 | Minamio et al. |
| 2002/0160552 A1 | 10/2002 | Minamio et al. |
| 2002/0163015 A1 | 11/2002 | Lee et al. |
| 2003/0071333 A1 | 4/2003 | Matsuzawa |
| 2003/0092205 A1 | 5/2003 | Wu et al. |
| 2003/0127711 A1 | 7/2003 | Kawai et al. |
| 2003/0170922 A1* | 9/2003 | Sakamoto et al. ............. 438/22 |
| 2004/0046237 A1 | 3/2004 | Abe et al. |
| 2004/0094829 A1 | 5/2004 | Minamio et al. |
| 2004/0124505 A1 | 7/2004 | Mahle et al. |
| 2004/0217450 A1 | 11/2004 | Li et al. |
| 2004/0262718 A1 | 12/2004 | Ramakrishna |
| 2005/0023667 A1 | 2/2005 | Lin et al. |
| 2005/0146058 A1 | 7/2005 | Danno |
| 2006/0033184 A1 | 2/2006 | Park et al. |
| 2006/0055009 A1 | 3/2006 | Shim et al. |
| 2006/0240600 A1 | 10/2006 | Ito et al. |
| 2007/0018291 A1 | 1/2007 | Huang et al. |
| 2007/0052076 A1 | 3/2007 | Ramos et al. |
| 2007/0059863 A1 | 3/2007 | Li et al. |
| 2007/0075404 A1 | 4/2007 | Dimaano et al. |
| 2007/0085199 A1 | 4/2007 | Ong et al. |
| 2007/0141756 A1 | 6/2007 | Iitani et al. |
| 2007/0164403 A1 | 7/2007 | Huang et al. |
| 2007/0164411 A1 | 7/2007 | Huang et al. |
| 2007/0181983 A1 | 8/2007 | Takai et al. |
| 2007/0194417 A1 | 8/2007 | Yoshida et al. |
| 2008/0029855 A1 | 2/2008 | Chang |
| 2008/0029856 A1 | 2/2008 | Chou et al. |
| 2008/0061414 A1 | 3/2008 | Retuta et al. |
| 2008/0067649 A1 | 3/2008 | Matsunaga et al. |
| 2008/0079124 A1 | 4/2008 | Haga et al. |
| 2008/0079127 A1 | 4/2008 | Gerber |
| 2008/0093715 A1 | 4/2008 | Lange et al. |
| 2008/0179758 A1 | 7/2008 | Wong et al. |
| 2008/0191325 A1 | 8/2008 | Shirasaka |
| 2008/0258278 A1 | 10/2008 | Ramos et al. |
| 2008/0258279 A1 | 10/2008 | Lin et al. |
| 2008/0311705 A1 | 12/2008 | Kim |
| 2009/0001540 A1 | 1/2009 | Yang et al. |
| 2009/0065914 A1 | 3/2009 | Engl |
| 2009/0189260 A1 | 7/2009 | Hasebe et al. |
| 2009/0189261 A1* | 7/2009 | Lim et al. ...................... 257/676 |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0267210 A1 | 10/2009 | Chuang |
| 2009/0278243 A1 | 11/2009 | Chuang |
| 2009/0283882 A1 | 11/2009 | Hsieh et al. |
| 2009/0315159 A1* | 12/2009 | Abbott .......................... 257/666 |
| 2010/0044843 A1 | 2/2010 | Chien et al. |
| 2010/0044850 A1 | 2/2010 | Lin et al. |
| 2010/0258920 A1 | 10/2010 | Chien et al. |
| 2010/0258921 A1 | 10/2010 | Chien et al. |

FOREIGN PATENT DOCUMENTS

| | | |
|---|---|---|
| CN | 2726111 | 9/2005 |
| CN | 1735963 | 2/2006 |

| | | |
|---|---|---|
| CN | 1985371 | 6/2007 |
| CN | 101587868 | 11/2009 |
| JP | 05166985 | 7/1993 |
| JP | 11195733 | 7/1999 |
| JP | 2001024135 | 1/2001 |
| JP | 2005317998 | 11/2005 |

OTHER PUBLICATIONS

Chien, et al., U.S. Appl. No. 12/425,635, filed Apr. 17, 2009 for "Advanced Quad Flat Non-Leaded Package Structure and Manufacturing Method Thereof." Office Action mailed Feb. 18, 2011.

Lin et al., U.S. Appl. No. 12/405,043, filed Mar. 16, 2009 for "Advanced Quad Flat Non-Leaded Package Structure and Manufacturing Method Thereof." Office Actions mailed Aug. 5, 2010, Jan. 7, 2011; Advisory Action mailed Mar. 22, 2011.

Chien et al., U.S. Appl. No. 12/192,702, filed Aug. 15, 2008 for "Advanced Quad Flat No Lead Chip Package Having A Cavity Structure and Manufacturing Methods Thereof." Office Actions mailed Nov. 17, 2010; Mar. 31, 2011.

Chien, et al., U.S. Appl. No. 12/192,742, filed Aug. 15, 2008 for "Semiconductor Chip Package Having Ground and Power Regions and Manufacturing Methods Thereof." Office Action mailed Feb. 8, 2011.

Chien et al., U.S. Appl. No. 12/192,761, filed Aug. 15, 2008 for "Advanced Quad Flat No Lead Chip Package Having Marking and Corner Lead Features and Manufacturing Methods Thereof." Office Action mailed Apr. 7, 2011.

Chen et al., U.S. Appl. No. 12/192,805, filed Aug. 15, 2008 for "Advanced Quad Flat No Lead Chip Package Having A Protective Layer to Enhance Surface Mounting and Manufacturing Methods Thereof." Office Action mailed May 27, 2010; Notice of Allowance mailed Oct. 29, 2010; Office Action mailed Mar. 21, 2011.

Lee et al., U.S. Appl. No. 12/683,426, filed Jan. 6, 2010 for "Leadframe Structure, Advanced Quad Flat No Lead Package Structure Using the Same and Manufacturing Methods Thereof.".

Chien et al., U.S. Appl. No. 12/192,702, filed Aug. 15, 2008 for "Advanced Quad Flat No Lead Chip Package Having A Cavity Structure And Manufacturing Methods Thereof." Final Office Action mailed Sep. 29, 2011.

Chien et al., U.S. Appl. No. 12/192,761, filed Aug. 15, 2008 for "Advanced Quad Flat No Lead Chip Package Having Marking And Corner Lead Features And Manufacturing Methods Thereof." Notice of Allowance mailed Oct. 13, 2011.

Chien, et al., U.S. Appl. No. 12/425,635, filed Apr. 17, 2009 for "Advanced Quad Flat Non-Leaded Package Structure And Manufacturing Method Thereof." Office Action mailed Oct. 27, 2011.

Chien et al., U.S. Appl. No. 12/547,787, filed Aug. 26, 2009 for "Manufacturing Method Of Advanced Quad Flat Non-Leaded Package." Notice of Allowance mailed Nov. 4, 2011.

Chien et al. U.S. Appl. No. 12/550,655, filed Aug. 31, 2009 for "Advanced Quad Flat-Leaded Package Structure and Manufacturing Method Thereof". Office Action mailed Dec. 7, 2011.

* cited by examiner ized by the shape of the leads of leadframes. Among them, the QFN package structures offer a variety of advantages, including reduced lead inductance, small-sized footprint, thinner profile and faster speeds for signal transmission. Thus, the QFN package has become one popular choice for the package structures and is suitable for the chip package with high-frequency (for example, radio frequency bandwidth) transmission.

SEMICONDUCTOR PACKAGE AND MANUFACTURING METHOD THEREOF

CROSS-REFERENCE TO RELATED APPLICATION

This application claims the priority benefit of U.S. provisional Application Ser. No. 61/168,220, filed on Apr. 10, 2009. The entirety of the above-mentioned patent application is hereby incorporated by reference herein and made a part of this specification.

BACKGROUND OF THE INVENTION

1. Field of the Invention

The present invention generally relates to a package structure and a manufacturing method thereof. More particularly, the present invention relates to an advanced quad flat non-leaded (a-QFN) package structure and a manufacturing method thereof.

2. Description of Related Art

Quad flat package (QFP) family includes I-type (QFI), J-type (QFJ) and non-lead-type (QFN) packages, characterized by the shape of the leads of leadframes. Among them, the QFN package structures offer a variety of advantages, including reduced lead inductance, small-sized footprint, thinner profile and faster speeds for signal transmission. Thus, the QFN package has become one popular choice for the package structures and is suitable for the chip package with high-frequency (for example, radio frequency bandwidth) transmission.

For the QFN package structure, the die pad and surrounding contact terminals (lead pads) are fabricated from a planar lead-frame substrate. The QFN package structure generally is soldered to the printed circuit board (PCB) through the surface mounting technology (SMT). Accordingly, the die pad or contact terminals/pads of the QFN package structure need to be designed to fit well within the packaging process capabilities, as well as promote good long term joint reliability.

SUMMARY OF THE INVENTION

The present invention is directed to an advanced quad flat non-leaded package structure and a manufacturing method thereof, which can help relieve delamination between the die pad and the molding compound and enhance the product reliability.

The present invention provides an advanced quad flat non-leaded package structure having a carrier having a die pad and a plurality of leads, a chip disposed on the carrier, a plurality of wires and a molding compound. The leads include a plurality of inner leads and a plurality of outer leads exposed by the molding compound. The die pad includes at least a peripheral portion and an accommodating cavity enclosed by the peripheral portion. At least the accommodating cavity has a rough surface, which is capable of increasing adhesion between the die pad and the surrounding molding compound. The wires are disposed between the chip and the inner leads. The molding compound encapsulates the chip, the die pad, the wires, the inner leads and filling up the accommodating cavity.

According to embodiments of the present invention, the carrier or at least the accommodating cavity of the die pad may be designed to have a rough surface for promoting the bonding capability of the carrier or at least the die pad with the surrounding molding compound. The rough surface may be a roughened upper surface of the carrier or a rough top surface of a coarse material layer formed over the carrier.

The present invention further provides a manufacturing method of an advanced quad flat non-leaded package structure. A substrate having an upper surface and a lower surface is provided, and the substrate includes at least an accommodating cavity and a plurality of inner lead portions defined by a plurality of openings there-between. The inner leads are disposed around the accommodating cavity. Later a roughening process is performed to the upper surface of the substrate, so as to provide a rough surface. A plurality of inner leads is formed by plating a first metal layer on the inner lead portions and a second metal layer on the lower surface of the substrate. Followed by providing a chip to the rough surface of the accommodating cavity of the substrate and forming a plurality of wires between the chip and the inner leads, a molding compound is formed over the substrate to encapsulate the chip, the wires, the inner leads, and filling the accommodating cavity. Afterwards, an etching process using the second metal layer as an etching mask is performed to etch through the substrate, until the molding compound filled inside the openings is exposed, so as to form a plurality of leads and a die pad.

According to embodiments of the present invention, the rough surface may be provided by roughening the upper surface of the substrate or by forming a coarse material layer with a rough surface over the substrate.

In order to make the above and other features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
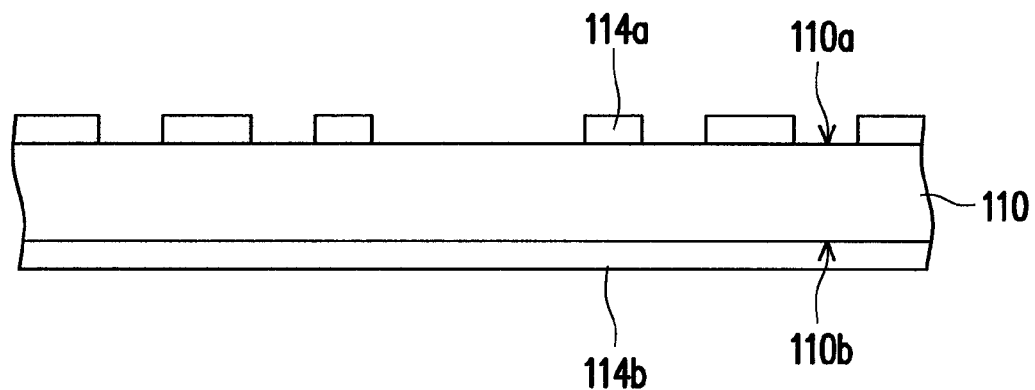
FIGS. 1A through 1G' are schematic cross-sectional views illustrating manufacturing methods of an advanced quad flat non-leaded (a-QFN) package structure according to embodiments of the present invention.

Reference will now be made in detail to the present preferred embodiments of the invention, examples of which are illustrated in the accompanying drawings. Wherever possible, the same reference numbers are used in the drawings and the descriptions to refer to the same or like parts.

FIGS. 1A through 1G' are schematic cross-sectional views illustrating manufacturing methods of an advanced quad flat non-leaded package structure according to embodiments of the present invention.

As shown in FIG. 1A, a substrate 110 having the upper surface 110a and the lower surface 110b is provided. The material of the substrate 110 can be, for example, copper, a copper alloy, or other applicable metal materials. Next, still referring to the FIG. 1A, a first patterned photoresist layer 114a is formed on the upper surface 110a of the substrate 110, and a second photoresist layer 114b is formed on the lower surface 110b of the substrate 110.

Figure 1B:
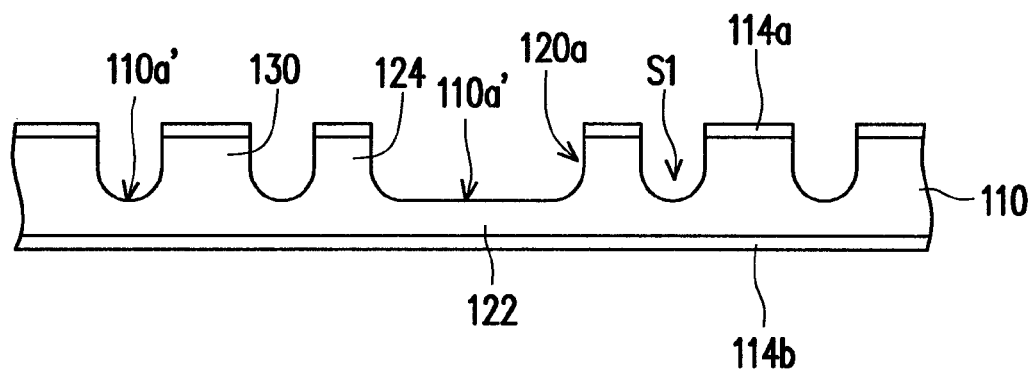

Next, referring to the FIG. 1B, using the first photoresist layer 114a as an etching mask, a half-etching process is performed to the upper surface 110a of the substrate 110, so as to remove portions of the substrate 110 and form at least an accommodating cavity 120a and a plurality of first openings S1. The etching process can be a wet etching process, for example. At the same time, the second photoresist layer 114b protects the lower surface 110b. The accommodating cavities 120a has a central portion 122 and a peripheral portion 124 disposed around the central portion 122. Defined by the openings S1, a plurality of individual inner lead portions 130, also separate from the peripheral portion 124, is formed. The inner lead portions 130 are disposed surrounding the peripheral portion 124. The inner lead portions 130 may be arranged in rows, columns or arrays. The peripheral portion 124 can function as the ground ring.

Figure 1C:
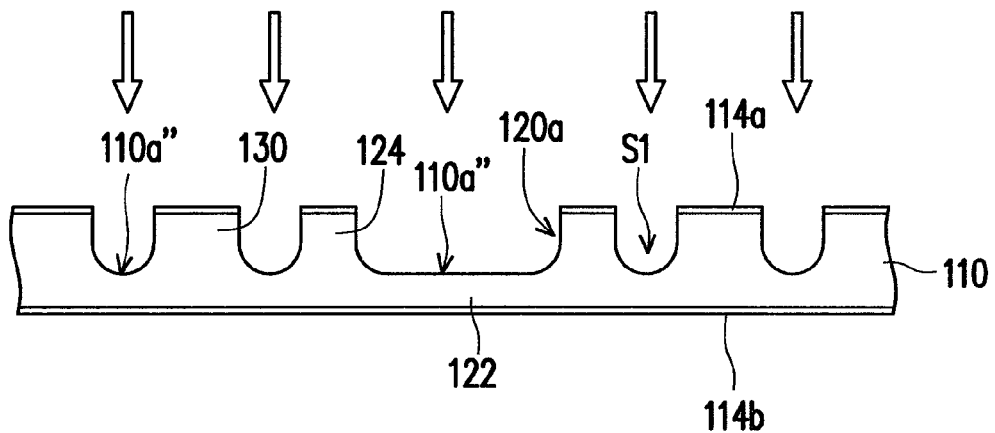

Referring to FIG. 1C, using the remained first photoresist layer 114a as a mask and the second photoresist layer 114b for protecting the lower surface 110b, a roughening process (shown in arrows) is performed to the exposed upper surface 110a' of the substrate 110, so that the exposed upper surface 110a' becomes a rough or roughened surface 110a". For example, the desirable roughness of the roughened surface 110a" is not less than 0.15 microns. However, the roughness of the roughened surface 110a" can be adjusted according to the choice of the molding compound. The roughening or abrading process can be achieved by performing a physical process or a chemical process. The physical process, for example, is a sand-blasting process. The chemical process can be an acidic etching process or an alkaline etching process. The acidic etching process may employ ferric chloride as the etchant, for example. The alkaline etching process may employ ammonium chloride as the etchant, for example.

Figure 1D:
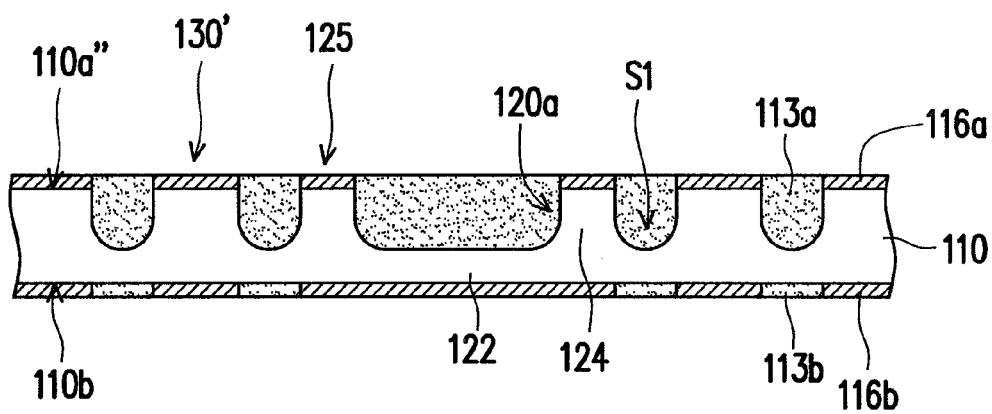
Figure 1C:
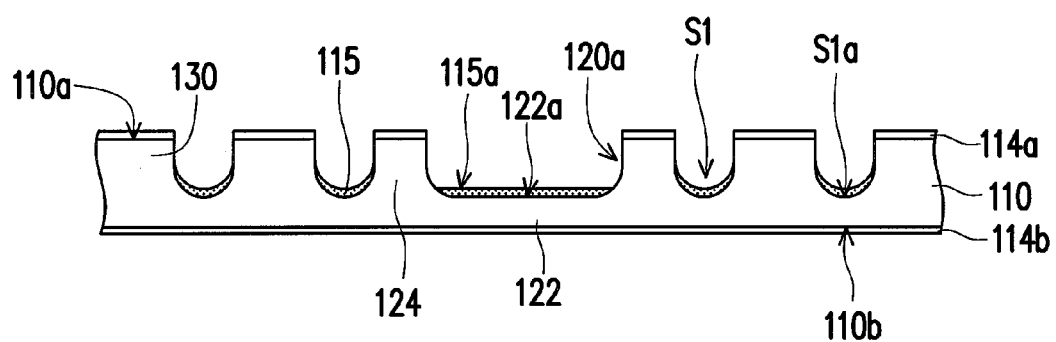
Figure 1D:
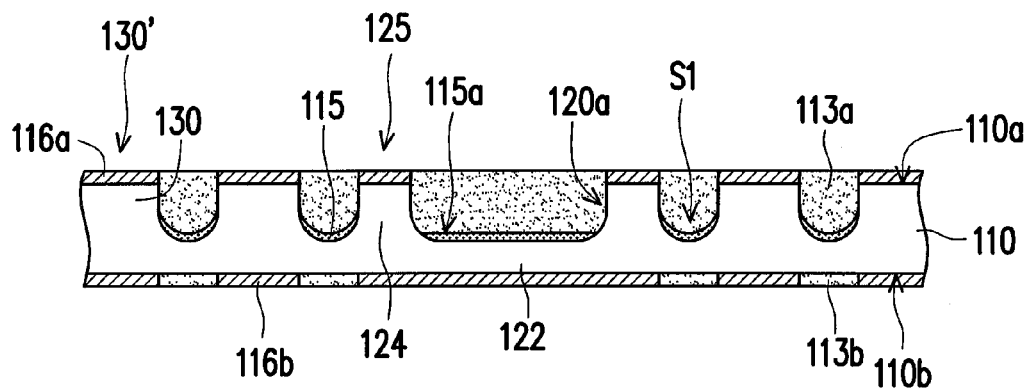

Referring to FIG. 1D, following FIG. 1C, after removing the first and second photoresist layers 114a/114b, a third photoresist layer 113a is formed over the upper surface 110a of the substrate 110, and a fourth patterned photoresist layer 113b is formed on the lower surface 110b of the substrate 110. The third photoresist layer 113a fills up the accommodating cavity 120a and the first openings S1. Later, a first metal layer 116a is formed on the exposed portions of the upper surface 110a" of the substrate 110, especially formed on the exposed surfaces of the inner lead portions 130, so as to form the inner leads 130'. A second metal layer 116b is formed on the exposed portions of the lower surface 110b of the substrate 110, using the fourth patterned photoresist layer as a mask. In the present embodiment, the first metal layer 116a and the second metal layer 116b may be formed by, for example, plating. As the first metal layer 116a is formed after the formation of the inner lead portions 130, the first metal layer 116a formed on the inner lead portion may be smaller than the underlying inner lead portion 130, up to 50% of the area of the inner lead portion 130. That is, the first metal layer 116a may cover about 50~100% of the central region of the underlying inner lead portion 130, for example. The first or second metal layer 116a/116b described herein may be composed of various groups of unconnected patterns or a continuous layer. The material of the first or second metal layer may comprise nickel, palladium or gold, for example. Preferably, the first or second metal layer can be a gold/nickel stacked layer, for example.

The inner lead portions 130 and the first metal layer 116a formed thereon are considered the inner leads 130'. The peripheral portion 124 and the first metal layer 116a formed thereon may function as a ground ring 125. Similarly, the patterns of the second metal layer 116b correspond to the inner leads 130' and the subsequently to-be-formed die pad.

Figure 2:
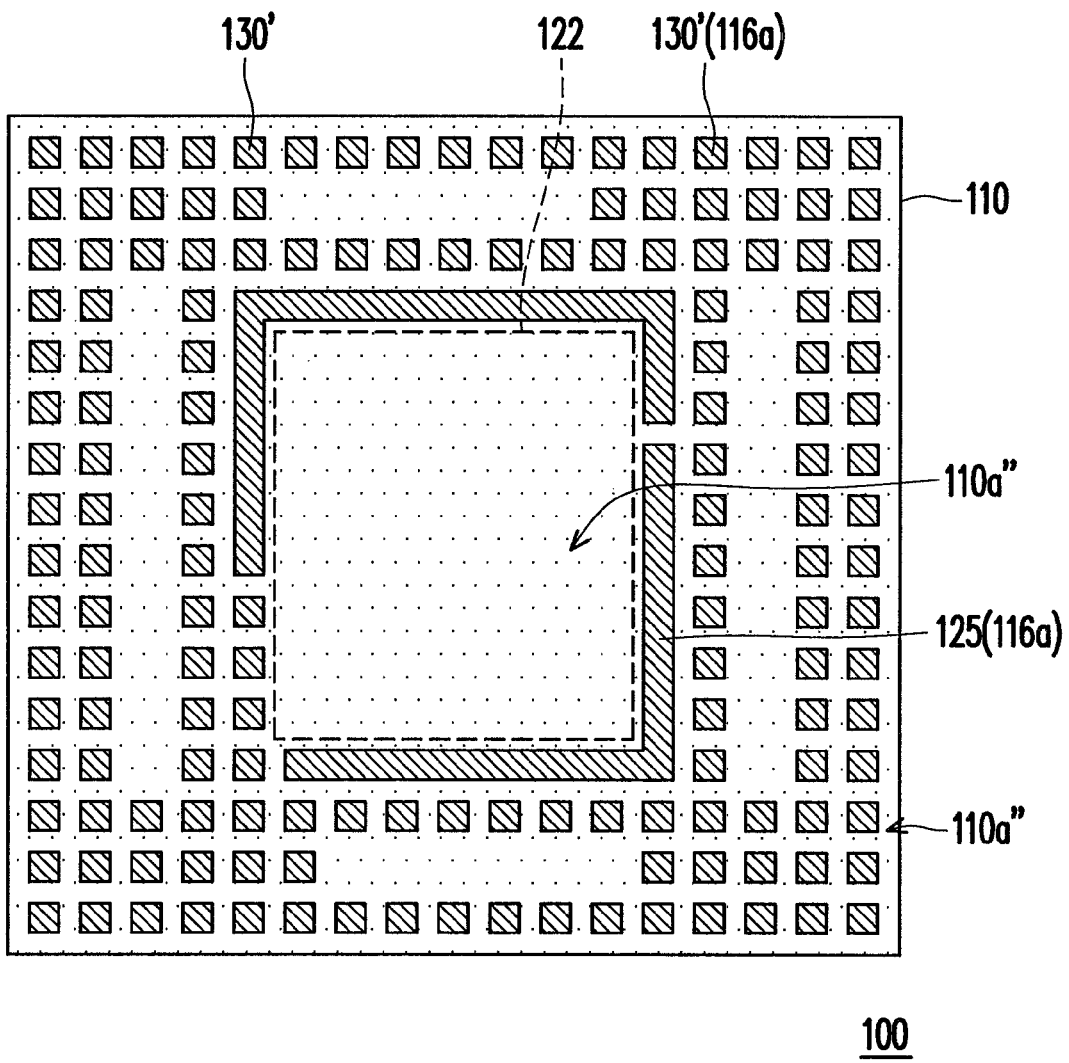
FIG. 2 shows a schematic top view of one example of the a-QFN package structure according to an embodiment of the present invention.

FIG. 2 shows a schematic top view of one example of the package structure following the manufacturing steps of FIGS. 1A, 1B, 1C and 1D. The photoresist layer 113a is skipped for the convenience of descriptions. The inner leads 130' are arranged surrounding the guard ring 125 of the carrier 100. From the top view, except the inner leads 130' and the guard ring 125 are covered by the first metal layer 116a, the roughened surface 110a" for other portions of the carrier 100 is exposed.

Alternatively, as shown in FIG. 1C', following FIG. 1B, the second photoresist layer 114b is removed. Next, using the first photoresist layer 114a as a mask, a coarse material layer 115 is blanketly formed over the exposed upper surface 110a' of the substrate 110, covering at least the bottom surface 122a of the accommodating cavity 120a and the bottom surfaces S1a of the openings S1. Depending on the conformity of the material of the coarse material layer 115, it is acceptable that the sidewalls of the cavity and/or the openings are not covered or merely partially covered. Due to the coarse texture of the coarse material layer 115, the coarse material layer 115 provides a rough surface 115a. The process of forming the coarse material layer 115 can be considered as a roughening process as well. For example, the desirable roughness of the rough surface 115a of the coarse material layer 115 is not less than 0.15 microns. The coarse material layer 115 can be a metal layer, such as a nickel or nickel alloy layer formed by plating, for example.

Referring to FIG. 1D', following FIG. 1C', after removing the remained first photoresist layer 114a, a third photoresist layer 113a is formed over the upper surface 110a of the substrate 110, and a fourth patterned photoresist layer 113b is formed on the lower surface 110b of the substrate 110. The third photoresist layer 113a fills up the accommodating cavity 120a and the first openings S1, thus covering the coarse material layer 115 within the accommodating cavity 120a and the first openings S1. Later, a first metal layer 116a is formed on the inner lead portions 130, so as to form the inner leads 130'. A second metal layer 116b is formed on the exposed portions of the lower surface 110b of the substrate 110, using the fourth patterned photoresist layer 113b as a mask. In the present embodiment, the first metal layer 116a and the second metal layer 116b may be formed by, for example, plating. The first or second metal layer 116a/116b described herein may be composed of various groups of unconnected patterns or a continuous layer.

The inner lead portions 130 together with the first metal layer 116a formed thereon are considered the inner leads 130'. The peripheral portion 124 together with the first metal layer 116a formed thereon may function as a ground ring 125. Similarly, the patterns of the second metal layer 116b correspond to the inner leads 130' and the subsequently to-be-formed die pad.

Figure 3:
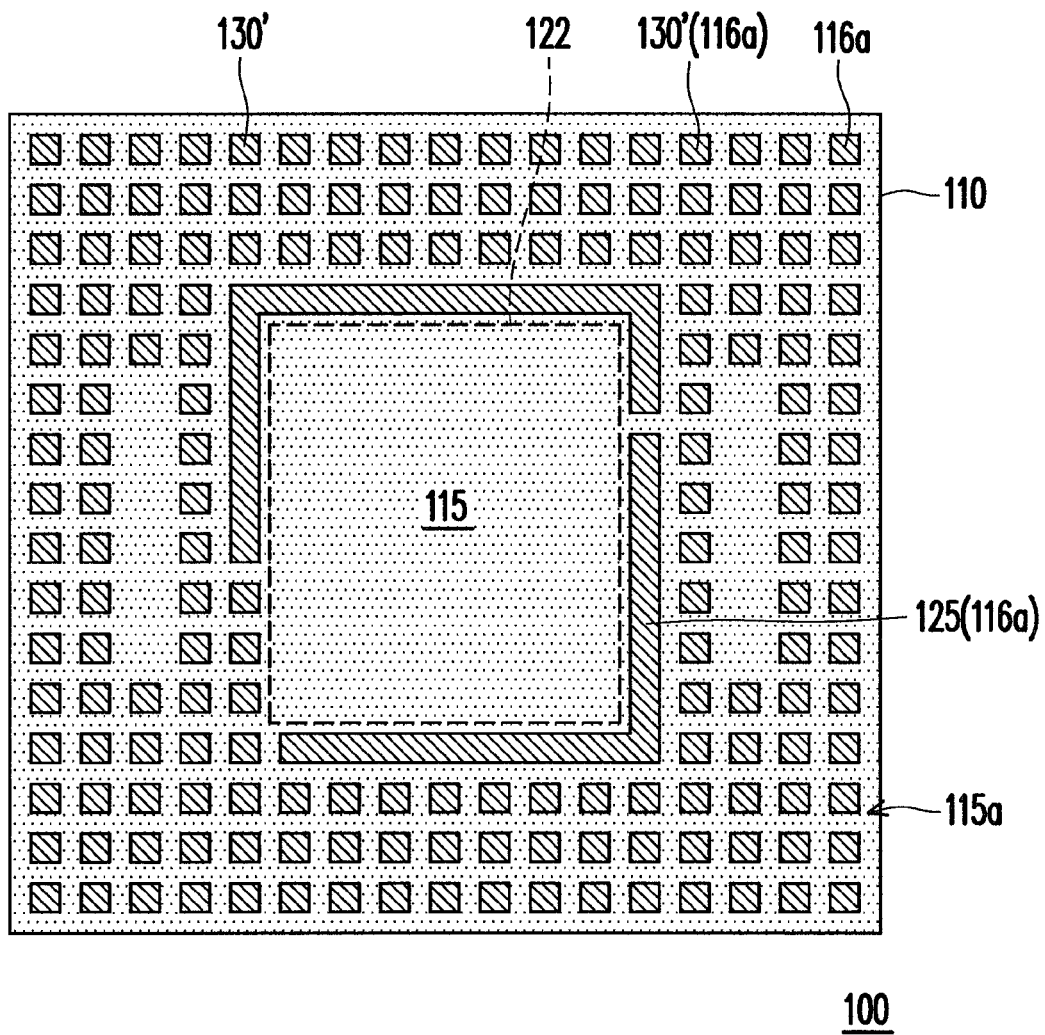
FIG. 3 shows a schematic top view of one example of the a-QFN package structure according to another embodiment of the present invention.

FIG. 3 shows a schematic top view of one example of the package structure following the manufacturing steps of FIGS. 1A, 1B, 1C' and 1D'. The photoresist layer 113a is skipped for the convenience of descriptions. The inner leads 130' are arranged surrounding the guard ring 125 of the carrier 100. From the top view, except the inner leads 130' and the guard ring 125 are covered by the first metal layer 116a, the other portions of the carrier 100 are covered by the coarse material layer 115.

Figure 1E:
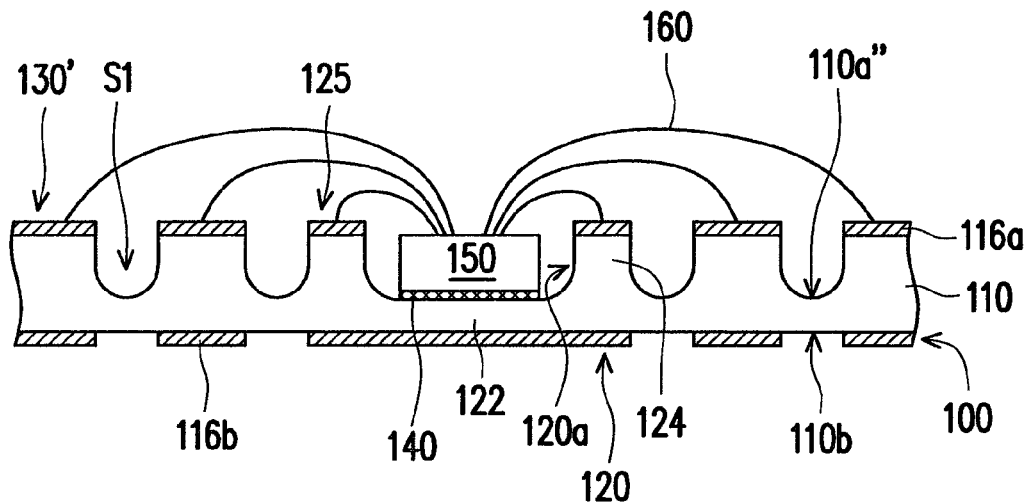

Referring to the FIG. 1E, following FIG. 1D, the third photoresist layer 113a and the fourth patterned photoresist layer 113b are removed. Then, at least a chip 150 is attached to the central portion 122 of each accommodating cavity 120a with an adhesive layer 140 in-between, and a plurality of wires 160 is provided between the chip 150, the peripheral portion 124 and the inner leads 130'. Hence, the chip 150 is electrically connected to the ground ring 125 and the inner leads 130 through the wires 160.

Figure 1F:
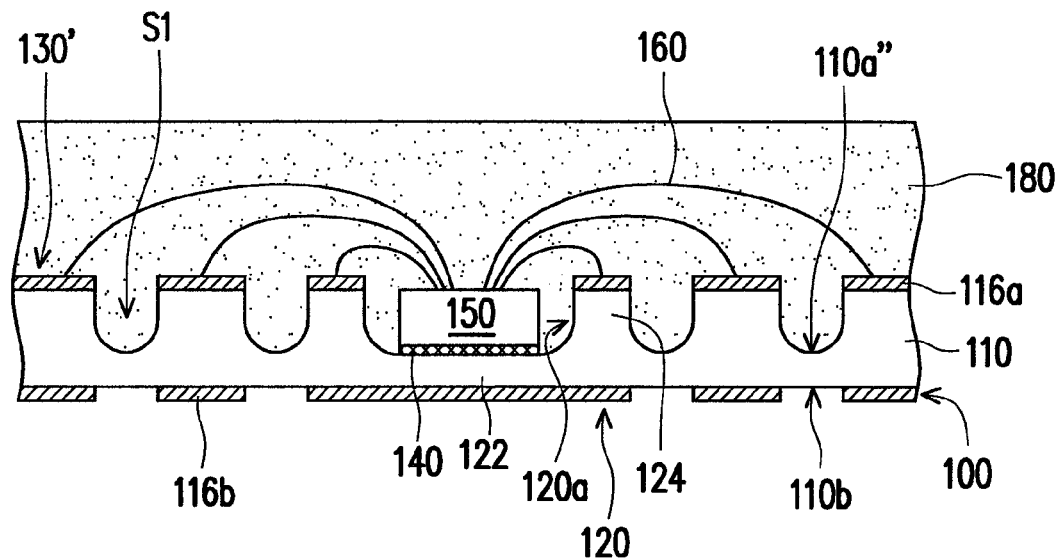

Next, referring to the FIG. 1F, a molding compound 180 is formed to encapsulate the chip 150, the wires 160, the inner leads 130', the peripheral portion 124, and fill up the accommodating cavities 120a and the first openings S1. Although the molding compound is described herein, any suitable package body can be used.

As the molding compound fills into the accommodating cavities 120a and the first openings S1 during the molding process, stronger bonding force is established between the molding compound 180 and the roughened surface 110a" (or the rough surface 115a of the coarse material layer 115), due to the elevated roughness. Hence, better adhesion is achieved between the molding compound 180 and the contact surfaces and delamination occurring at the interface of the molding compound 180 and the carrier 100 is minimized.

Figure 1G:
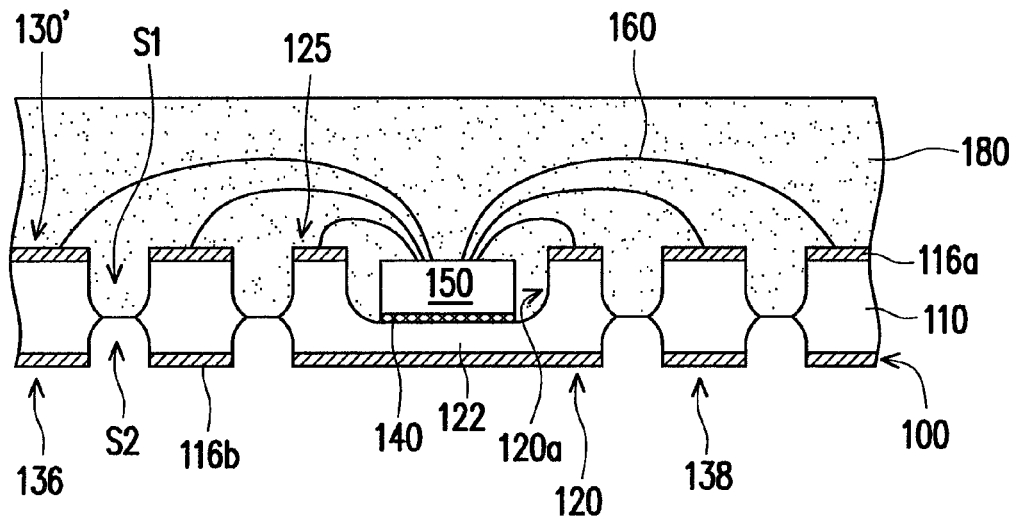
Figure 1G:
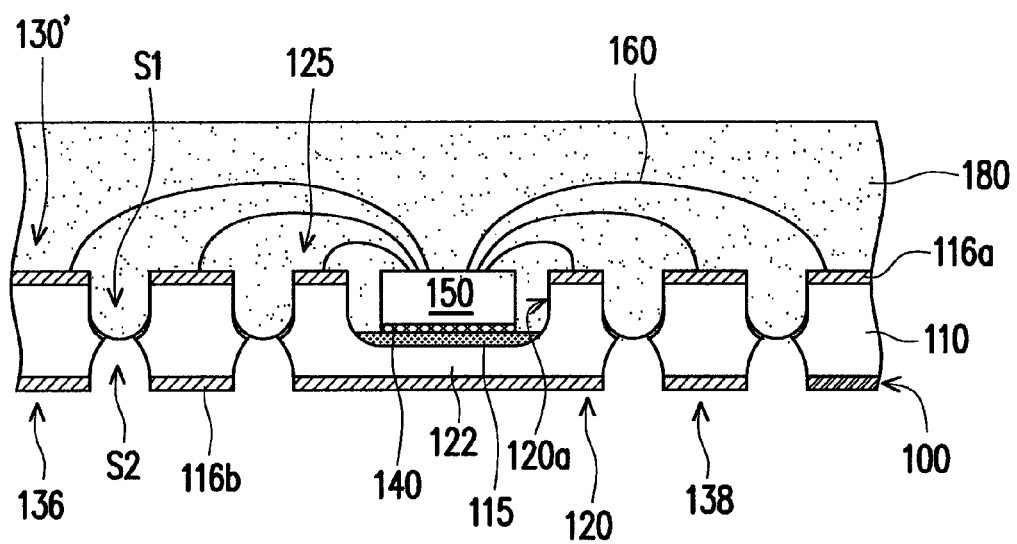

Then, referring to the FIG. 1G, using the second metal layer 116b as an etching mask, an etching process is performed toward the lower surface 110b of the carrier 100 to remove a portion of the substrate 110, so that the substrate 110 is etched through to expose the molding compound 180 filled inside the first openings S1 and simultaneously form a plurality of second openings S2. Owning to the formation of the second openings S2, a plurality of outer leads 136 is defined and the inner leads 130' are electrically isolated from one another. That is, after the etching process, a plurality of leads or contact terminals 138, each consisting of one inner lead 130' and the corresponding outer lead 136, is formed. Besides, the etching process further defines at least a die pad 120 of the carrier 100. The die pad 120 is surrounded by the leads 138 and isolated from the leads 138 through the second openings S2. On the whole, the leads 138 are electrically isolated from one another through this etching process. In general, the patterns of the second metal layer 116b correspond to or are mostly symmetric (except for the location of the to-be-formed die pad) to those of the first metal layer 116a.

Alternatively, referring to FIG. 1G' for the package structure fabricated through the steps of FIGS. 1A-B, 1C', 1D' and 1E-F, using the second metal layer 116b as an etching mask, an etching process is performed toward the lower surface 110b of the carrier 100 to remove a portion of the substrate 110, so that the substrate 110 is etched through to expose the molding compound 180 filled inside the first openings S1 and simultaneously form a plurality of second openings S2. As shown in FIG. 1G', the coarse material layer 115 within the accommodating cavity 120a is remained while the coarse material layer 115 within the first openings S1 is partially removed. Depending on the etching conditions, it is acceptable that the coarse material layer 115 within the first openings S1 is completely removed.

In detail, in the present embodiment, at least due to the existence of the coarse material layer 115 within the accommodating cavity 120a, binding between the die pad 120 and the surrounding molding compound 180 can be enhanced, so that the delamination is greatly lessened and the product reliability can be greatly improved.

Finally, a singulation process is performed to obtain individual a-QFN package structures.

Figure 4:
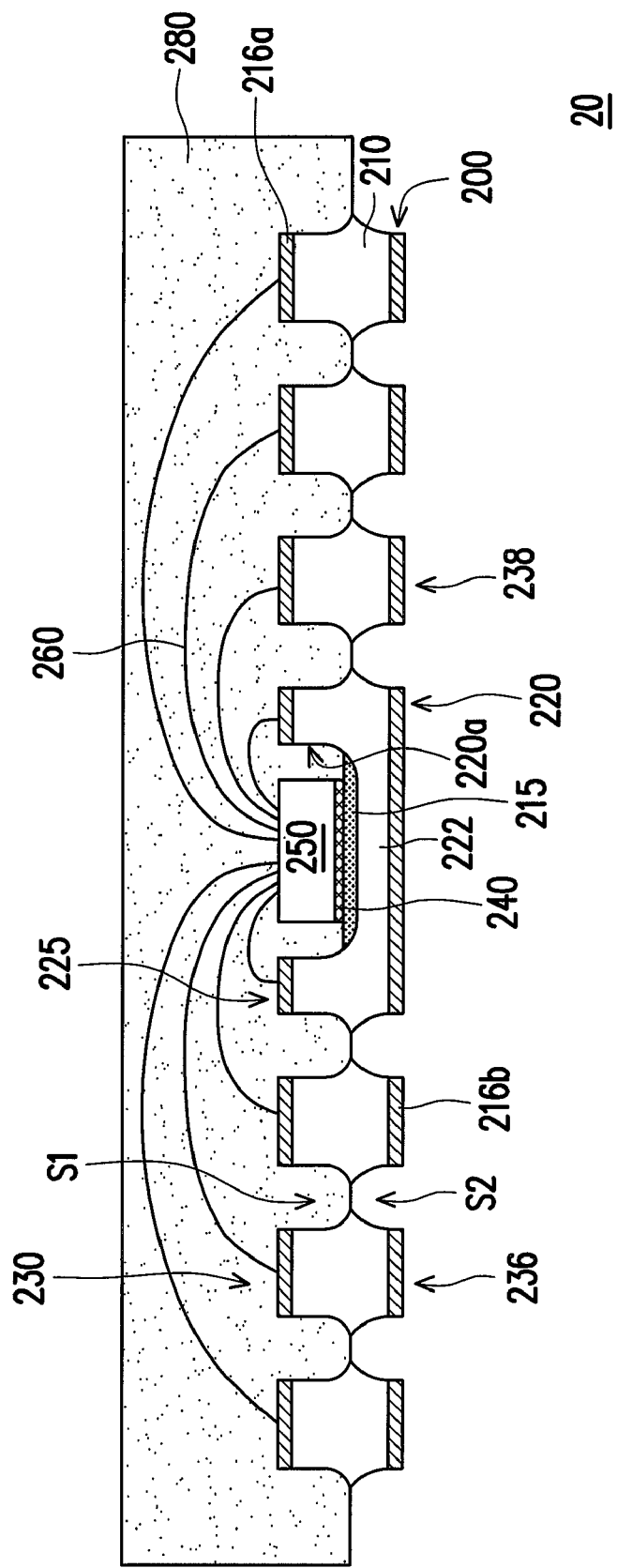
FIG. 4 is a schematic cross-sectional view for one example of the a-QFN package structure having a coarse material layer according to an embodiment of the present invention.

FIG. 4 is a schematic cross-sectional view for one example of the a-QFN package structure having a coarse material layer according to an embodiment of the present invention. Referring to FIG. 4, an advanced quad flat non-leaded (a-QFN) package structure 20 includes a carrier 200, a chip 250, and a plurality of wires 260.

The carrier 200 in the present embodiment is, for example, a metal leadframe. In detail, the carrier 200 includes a die pad 220 and a plurality of contact terminals (leads) 238. The leads 238 include a plurality of inner leads 230 and a plurality of outer leads 236. The inner leads and the outer leads are defined by the molding compound; that is, the portions of the leads that are encapsulated by the molding compound are defined as the inner leads, while the outer leads are the exposed portions of the leads.

In FIG. 4, the leads 238 are disposed around the die pad 220, and only three columns/rows of the contact terminals 238 are schematically depicted. However, the arrangement of the leads (contact terminals) should not be limited by the exemplary drawings and may be modified according to the product requirements. Specifically, the inner leads 230 include a first metal layer 216a thereon. The coarse material layer 215 within the accommodating cavity 220a is disposed between the chip 250 and the die pad 220. That is, the chip 250 is attached to the coarse material layer 215 on the die pad 220 with an adhesive 240. The material of the coarse material layer 215 should be compatible with the adhesive 240, and the material of the coarse material layer 215 may comprise nickel, or nickel alloys, for example. The material of the first metal layer may comprise nickel, gold palladium or combinations thereof, for example.

In addition, the a-QFN package structure 20 in the present embodiment further includes a molding compound 280. The molding compound 280 encapsulates the chip 250, the wires 260, the inner leads 230 and fills the openings S1 between the inner leads 230, while the outer leads 236 and the bottom surface of the die pad 220 are exposed. A material of the molding compound 280 is, for example, epoxy resins or other applicable polymer material.

Further, in the present embodiment, to meet the electrical integration design requirement of the a-QFN package structure 20, the carrier 200 further includes at least a ground ring 225. The ground ring 225 is disposed between the leads 238 and the die pad 220 and electrically connected to the chip 250 through wires 260. As the ground ring 225 is connected to the die pad 220, the die pad together with the ground ring may function as the ground plane.

For the a-QFN package structures according to the above embodiments, the presence or existence of the roughened surfaces or the coarse material layer that provides the rough surface, the adhesion between the molding compound and the carrier, especially the die pad portion, is significantly enhanced.

The a-QFN package structures in the present embodiments are designed to the bonding of the molding compound (i.e. stronger adhesion between the carrier and the molding compound) to solve the delamination problems and improve the product reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   a carrier including a die pad and a plurality of leads disposed around the die pad, wherein the die pad includes a peripheral portion and defines a cavity circumscribed by the peripheral portion;
   a chip located within the cavity and disposed on a first rough surface within the cavity; and
   a package body encapsulating the chip and substantially filling the cavity;
   wherein the peripheral portion of the die pad includes an upper sloped portion, a lower sloped portion, and a peak between the upper sloped portion and the lower sloped portion, the lower sloped portion protruding from the package body; and
   wherein a second rough surface is selectively formed on the upper sloped portion without being formed on the lower sloped portion.

2. The package structure of claim 1, wherein the first rough surface is a bottom surface of the cavity.

3. The package structure of claim 1, wherein:
   a coarse material layer is formed on a bottom surface of the cavity; and
   the first rough surface is an upper surface of the coarse material layer.

4. The package structure of claim 1, wherein the package body is in direct contact with the first rough surface of the cavity.

5. The package structure of claim 1, wherein a roughness of the first rough surface is not less than 0.15 microns.

6. A package structure, comprising:
   a die pad including a peripheral portion and defining a cavity circumscribed by the peripheral portion;
   a plurality of leads disposed around the die pad, each of the plurality of leads including an upper sloped portion, a lower sloped portion, and a peak at a junction between the upper sloped portion and the lower sloped portion;
   a chip located within the cavity and disposed on a first rough surface within the cavity; and
   a package body encapsulating the chip and the upper sloped portion of each of the plurality of leads;
   wherein a second rough surface of at least one of the plurality of leads is confined to the upper sloped portion of the at least one of the plurality of leads without extending to the lower sloped portion of the at least one of the plurality of leads.

7. The package structure of claim 6, wherein the first rough surface is a bottom surface of the cavity.

8. The package structure of claim 6, wherein:
   a coarse material layer is formed on a bottom surface of the cavity; and
   the first rough surface is an upper surface of the coarse material layer.

9. The package structure of claim 8, wherein the package body is in contact with the upper surface of the coarse material layer within the cavity.

10. The package structure of claim 6, wherein the peripheral portion of the die pad includes at least one ground segment electrically connected to the chip.

11. The package structure of claim 6, wherein:
    a coarse material layer is formed on the upper sloped portion of the at least one of the plurality of leads; and
    the second rough surface is an upper surface of the coarse material layer.

12. The package structure of claim 6, wherein a roughness of the second rough surface is not less than 0.15 microns.

13. A package structure, comprising:
    a carrier including a die pad and a plurality of leads disposed around the die pad, wherein the die pad includes a peripheral portion and defines a cavity circumscribed by the peripheral portion, a first rough surface being located within the cavity and
    a package body attached to at least a portion of the first rough surface of the cavity;
    wherein each of the plurality of leads includes an upper sloped portion, a lower sloped portion, and a peak at a junction between the upper sloped portion and the lower sloped portion;
    wherein the lower sloped portion of each of the plurality of leads protrudes from the package body wherein the peripheral portion of the die pad includes an upper sloped portion, a lower sloped portion, and a peak between the upper sloped portion and the lower sloped portion, the lower sloped portion protruding from the package body, and wherein a second rough surface of the die pad is selectively formed on the upper sloped portion without being formed on the lower sloped portion.

14. The package structure of claim 13, wherein the first rough surface promotes adhesion with the package body.

15. The package structure of claim 13, wherein:
    a coarse material layer is formed on a bottom surface of the cavity; and
    the first rough surface is an upper surface of the coarse material layer.

16. The package structure of claim 13, further comprising a plurality of leads disposed around the die pad, each of the plurality of leads including an upper sloped portion and a lower sloped portion, wherein a second rough surface is confined to the upper sloped portion of at least one of the plurality of leads without extending to the lower sloped portion of the at least one of the plurality of leads.

17. The package structure of claim 16, wherein the second rough surface promotes adhesion with the package body.

18. The package structure of claim 16, wherein the second rough surface promotes a stronger bonding force with the package body.

19. The package structure of claim 16, wherein a roughness of the second rough surface is a least 0.15 microns.

20. The package structure of claim 13, wherein the first rough surface promotes a stronger bonding force with the package body.

21. The package structure of claim 13, wherein a roughness of the first rough surface is at least 0.15 microns.

* * * * *